US012677373B2

(12) United States Patent
Lin

(10) Patent No.: US 12,677,373 B2
(45) Date of Patent: Jul. 7, 2026

(54) CIRCUIT BOARD ASSEMBLY, CIRCUIT BOARD STACK STRUCTURE, AND ELECTRONIC DEVICE

(71) Applicant: VIVO MOBILE COMMUNICATION CO., LTD., Guangdong (CN)

(72) Inventor: XieYuan Lin, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 232 days.

(21) Appl. No.: 18/434,639

(22) Filed: Feb. 6, 2024

(65) Prior Publication Data

US 2024/0224425 A1 Jul. 4, 2024

Related U.S. Application Data

(63) Continuation of application No. PCT/CN2022/110556, filed on Aug. 5, 2022.

(30) Foreign Application Priority Data

Aug. 11, 2021 (CN) .......................... 202110921182.6

(51) Int. Cl.
*H05K 1/14* (2006.01)
*H05K 1/11* (2006.01)
(52) U.S. Cl.
CPC ............. *H05K 1/144* (2013.01); *H05K 1/117* (2013.01); *H05K 2201/041* (2013.01)
(58) Field of Classification Search
CPC ... H05K 1/144; H05K 1/117; H05K 2201/041
(Continued)

(56) References Cited

U.S. PATENT DOCUMENTS 5,707,242 A * 1/1998 Mitra ................. H01R 12/7076
439/74
10,707,600 B1 7/2020 Wilcox et al.
(Continued)

FOREIGN PATENT DOCUMENTS

CN 112753288 A 5/2021
CN 113133198 A 7/2021
(Continued)

OTHER PUBLICATIONS

Extended European Search Report for Application No. 22855349.1, dated Oct. 28, 2024, 9 Pages.
(Continued)

*Primary Examiner* — Binh B Tran
(74) *Attorney, Agent, or Firm* — BROOKS KUSHMAN P.C.

(57) ABSTRACT

A circuit board stack structure includes a third circuit board, a circuit board assembly, and a second circuit board that are stacked in sequence. The circuit board assembly includes a first connector, a first circuit board, and a second connection base that are stacked in sequence, where the first connector includes a second electrical connection portion and a second connection portion, and the second connection base includes a fourth connection portion; a first conducting wire on the first circuit board, the third connection portion, and the second connection portion are electrically connected in sequence, forming a second path between the first circuit board and the third circuit board; and the fourth connection portion, the fourth electrical connection portion, the third electrical connection portion, and the second electrical connection portion are electrically connected in sequence, forming a first path between the second circuit board and the third circuit board.

10 Claims, 9 Drawing Sheets

(58) Field of Classification Search
    USPC .......................................................... 361/784
    See application file for complete search history.

(56)                    References Cited

U.S. PATENT DOCUMENTS

2005/0091440 A1      4/2005  Isa et al.
2009/0137134 A1      5/2009  Chen
2011/0256742 A1*   10/2011  Panella .................. H04Q 1/136
                                                            439/55
2022/0102881 A1*     3/2022  Lloyd ................. H01L 23/3672

FOREIGN PATENT DOCUMENTS

CN              113677093 A      11/2021
JP              2002252468 A       9/2002

OTHER PUBLICATIONS

International Search Report and Written Opinion for Application
No. PCT /CN2022/110556, dated Nov. 7, 2022, 8 Pages.

* cited by examiner

View in a direction A

View in a direction B

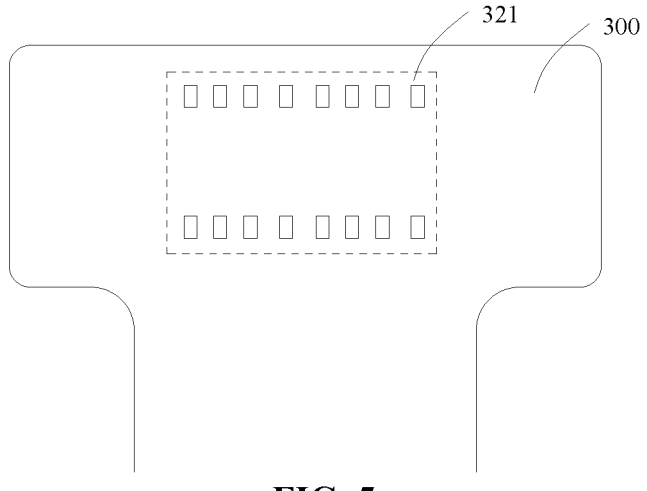
FIG. 5
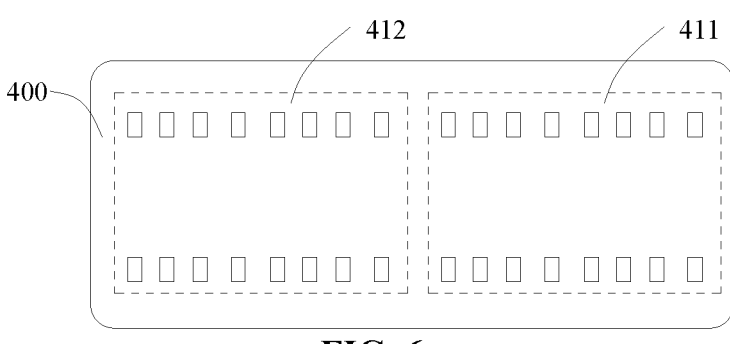
FIG. 6
FIG. 7

Cross-sectional view in a
direction C-C

Cross-sectional view in a
direction D-D

CIRCUIT BOARD ASSEMBLY, CIRCUIT BOARD STACK STRUCTURE, AND ELECTRONIC DEVICE

CROSS-REFERENCE TO RELATED APPLICATIONS

This application is a continuation of International Application No. PCT/CN2022/110556, filed on Aug. 5, 2022, which claims priority to Chinese Patent Application No. 202110921182.6 filed on Aug. 11, 2021, which are incorporated herein by reference in their entireties.

TECHNICAL FIELD

This application relates to the field of electronic device technologies, and in particular, to a circuit board assembly, a circuit board stack structure, and an electronic device.

BACKGROUND

With the continuous development of electronic devices, a quantity of internal devices is also increasing. Taking a mobile phone as an example, various functional devices in the mobile phone, such as a lens, a memory, a graphics card, and the like, need to be supplied with power by connecting to a circuit board or the like.

In the related art, circuit boards are usually laid in parallel on a main board to achieve their respective power supply. However, with this arrangement, when a layout area on the main board is limited, a quantity of circuit boards that can be arranged is also limited. In this way, the quantity of functional devices that can be mounted is limited, and the integration and utilization of the circuit boards cannot be further improved.

SUMMARY

According to a first aspect, this application discloses a circuit board assembly, including a first connector, a first circuit board, and a second connection base that are stacked in sequence, where the first connector is provided with a second electrical connection portion and a second connection portion, and the second connection base is provided with a fourth connection portion; a surface of the first circuit board that faces the first connector is provided with a third electrical connection portion and a third connection portion, and a surface of the first circuit board that faces the second connection base is provided with a fourth electrical connection portion; the first circuit board includes a first conducting wire, and the first conducting wire, the third connection portion, and the second connection portion are electrically connected in sequence to form a second path; and the fourth connection portion, the fourth electrical connection portion, the third electrical connection portion, and the second electrical connection portion are electrically connected in sequence to form a first path.

According to a second aspect, this application discloses a circuit board stack structure, including a third circuit board, a circuit board assembly, and a second circuit board that are stacked in sequence, where a surface of the third circuit board that faces the circuit board assembly is provided with a first connection base, and the third circuit board is connected to the first connector through the first connection base; a surface of the second circuit board that faces the circuit board assembly is provided with a second connector, and the second circuit board is connected to the second connection base through the second connector; the third circuit board is provided with a first receiving portion and a second receiving portion, the first connection base is provided with a first electrical connection portion and a first connection portion, the second connector is provided with a fifth connection portion, and the second circuit board is provided with a sixth connection portion; in the first path, the sixth connection portion, the fifth connection portion, the fourth connection portion, the fourth electrical connection portion, the third electrical connection portion, the second electrical connection portion, the first electrical connection portion, and the first receiving portion are electrically connected in sequence; and in the second path, the first conducting wire, the third connection portion, the second connection portion, the first connection portion, and the second receiving portion are electrically connected in sequence.

According to a third aspect, this application discloses an electronic device, including a circuit board assembly.

BRIEF DESCRIPTION OF THE DRAWINGS

The accompanying drawings described herein are used for providing a further understanding of this application, and form a part of this application. Exemplary embodiments and descriptions of this application are used for explaining this application, and do not constitute any inappropriate limitation to this application. In the accompanying drawings:

FIG. 5 is a front structural diagram of a first circuit board according to an embodiment of this application;

FIG. 6 is a rear structural diagram of a transition board according to an embodiment of this application;

FIG. 7 is a front structural diagram of a transition board according to an embodiment of this application;

REFERENCE NUMERALS

Figure 1:
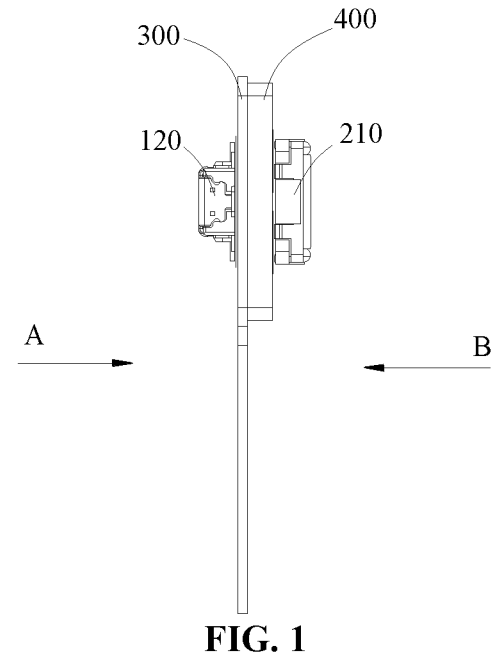
FIG. 1 is a structural diagram of a circuit board assembly according to an embodiment of this application.

20—Second path, 10—First path,
100—First board-to-board connector,
110—First connection base, 111—First electrical connection portion, 112—First connection portion,
120—First connector, 121—Second electrical connection portion, 122—Second connection portion,
200—Second board-to-board connector, 210—Second connection base, 211—Fourth connection portion,
220—Second connector, 221—Fifth connection portion,
300—First circuit board,
311—Third electrical connection portion, 312—Third connection portion,
321—Fourth electrical connection portion,
400—Transition board,
411—Fifth electrical connection portion, 412—Reserved connection portion,
421—Sixth electrical connection portion,
500—Second circuit board,
501—Sixth connection portion,
600—Reinforcement board,
700—Third circuit board,
710—Accommodating hole, 701—First receiving portion, and 702—Second receiving portion.

DETAILED DESCRIPTION

In order to make the objectives, technical solutions and advantages of this application clearer, the technical solutions of this application will be described clearly in combination with specific embodiments of this application and corresponding accompanying drawings. Obviously, the described embodiments are only parts of the embodiments of this application and not the whole embodiments. All other embodiments obtained by a person of ordinary skill in the art based on the embodiments of this application without creative efforts shall fall within the protection scope of this application.

As shown in FIG. 1 to FIG. 13, this application discloses a circuit board stack structure. The circuit board stack structure may include a third circuit board 700, a circuit board assembly, and a second circuit board 500 that are stacked in sequence.

The third circuit board 700 may be a main board to be used as a mounting base of the circuit board stack structure of this application. The second circuit board 500 may be a flexible printed circuit (FPC), and the flexible printed circuit may be arranged in the circuit board assembly.

Using the circuit board stack structure, independent current paths can be formed between the third circuit board 700 and the circuit board assembly, and between the third circuit board 700 and the second circuit board 500. Compared with a tiled patch arrangement on the main board in the related art, in the stack structure arrangement of this application, more circuit boards can be laid out without changing a layout area, thereby improving the overall integration and utilization, and further meeting power supply needs of more functional devices.

To achieve the foregoing technical effects, the circuit board assembly is first introduced.

Referring to FIG. 1 to FIG. 8, the circuit board assembly of this application may include a first connector 120, a first circuit board 300, and a second connection base 210 that are stacked in sequence. The first circuit board 300 may be a structure such as a flexible printed circuit or a data line, and the first connector 120 and the second connection base 210 may be set as interfaces arranged on two sides of the first circuit board 300, for inputting and outputting of current.

Figure 2:
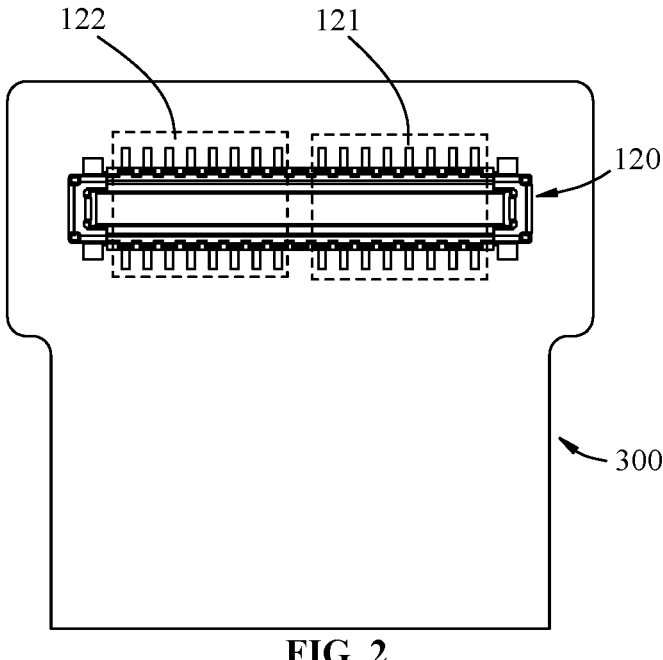
FIG. 2 is a view in a direction A of FIG. 1 according to an embodiment of this application.
Figure 3:
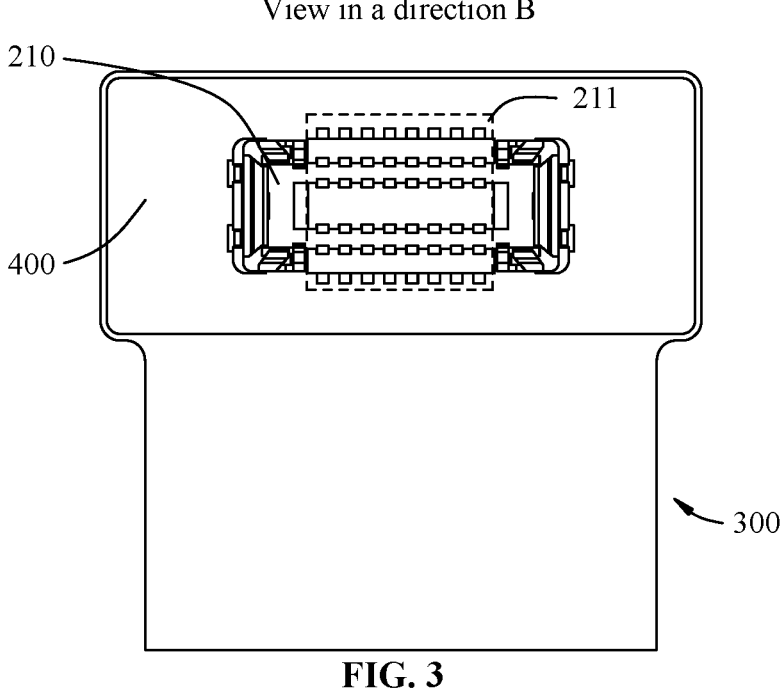
FIG. 3 is a view in a direction B of FIG. 1 according to an embodiment of this application.

As shown in FIG. 1 to FIG. 3, the first connector 120 may be provided with a second electrical connection portion 121 and a second connection portion 122. The second electrical connection portion 121 and the second connection portion 122 can both be set as interfaces to connect to different functional devices. The second connection base 210 is provided with a fourth connection portion 211, and the fourth connection portion 211 may also be set as an interface to connect to the second electrical connection portion 121.

Figure 4:
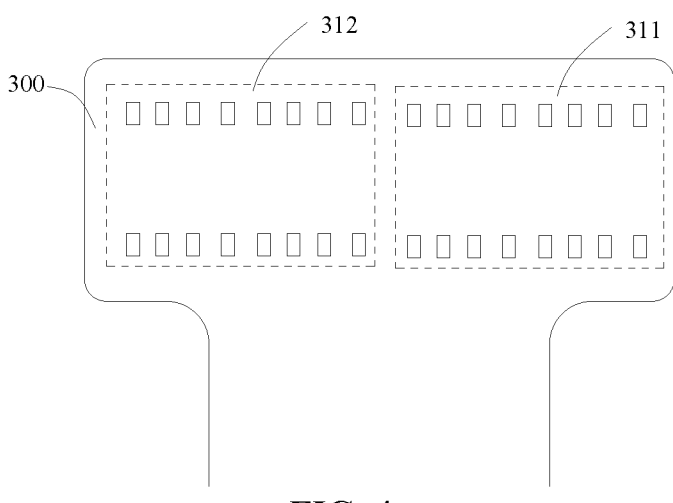
FIG. 4 is a rear structural diagram of a first circuit board according to an embodiment of this application.

As shown in FIG. 1, FIG. 4, and FIG. 5, a surface of the first circuit board 300 that faces the first connector 120 may be provided with a third electrical connection portion 311 and a third connection portion 312, and a surface of the first circuit board 300 that faces the second connection base 210 may be provided with a fourth electrical connection portion 321.

Figure 8:
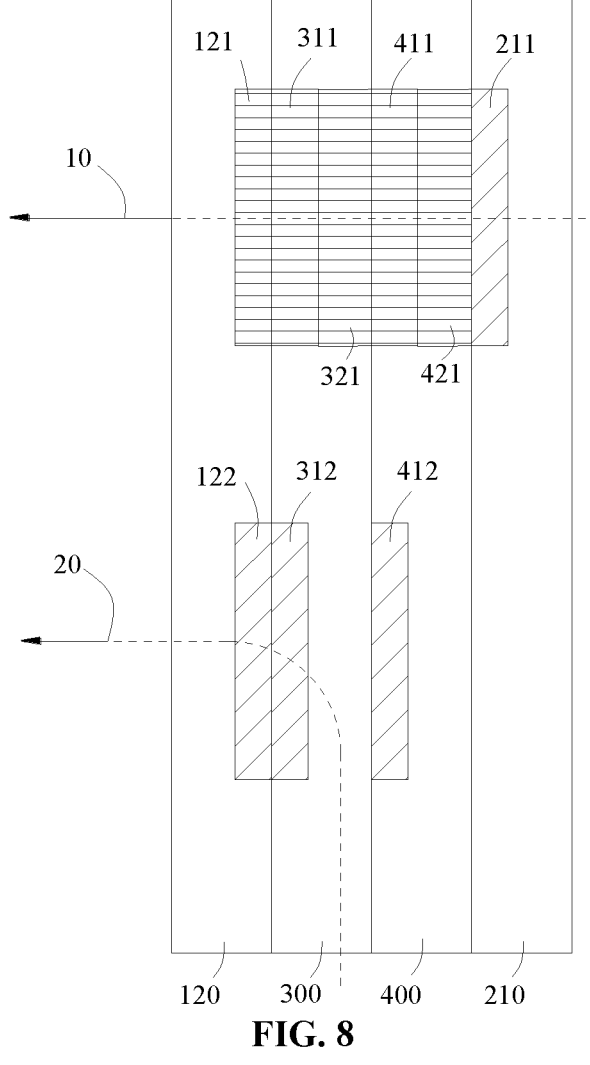
FIG. 8 is a path diagram of a first path and a second path in a circuit board assembly according to an embodiment of this application.

As shown in FIG. 8, the third connection portion 312 and the second connection portion 122 correspond to each other in position, and are, for example, respectively set as pins and pads, so that the third connection portion 312 can be welded to the second connection portion 122, to establish an electrical connection between the third connection portion 312 and the second connection portion 122.

In addition, a first conducting wire is arranged on the first circuit board 300. The first conducting wire can be etched on the first circuit board 300 in a printing manner, or arranged on the first circuit board 300. The first conducting wire is connected to the third connection portion 312. The first conducting wire is used as a transmission medium for electric energy and can realize electrical conduction to the third connection portion 312.

Using the arrangement method, the first conducting wire, the third connection portion 312, and the second connection portion 122 can be electrically connected in sequence to form a second path 20. In this way, a current from an external power supply can be introduced into the first circuit board 300 through the first conducting wire, and then output through the third connection portion 312 and the second connection portion 122 in sequence. It can be seen that the second connection portion 122 is a current output end of the second path 20, and the first conducting wire is a current input end of the second path 20.

The fourth electrical connection portion 321 and the third electrical connection portion 311 correspond to each other in position, the fourth connection portion 211 and the fourth electrical connection portion 321 correspond to each other in position, and the third electrical connection portion 311 and the second electrical connection portion 121 correspond to each other in position, which are, for example, set as pins or pads, so that the fourth connection portion 211, the fourth electrical connection portion 321, the third electrical connection portion 311, and the second electrical connection portion 121 are electrically connected in sequence to form the first path 10.

In this structure, the first conducting wire laid out on the first circuit board 300 does not pass through the fourth electrical connection portion 321 and the third electrical connection portion 311, so that the fourth connection portion 211 can be a current input end of the first path 10, and the second electrical connection portion 121 can be a current output end of the first path 10.

It can be seen that in the circuit board assembly structure, the third connection portion 312 is set as a "self-use" part of the first circuit board 300, and the first conducting wire arranged on the first circuit board 300 is connected to the third connection portion 312, thereby realizing the conduction of the second path 20.

The first conducting wire arranged on the first circuit board 300 is isolated from each of the third electrical connection portion 311 and the fourth electrical connection portion 321, that is, the third electrical connection portion 311 and the fourth electrical connection portion 321 are set as a "bridge" part of the first circuit board 300. The "bridge"

part is used as a transitional link between the preceding and the following, and is not interfered by the first conducting wire arranged inside the first circuit board 300, and the whole formed by the third electrical connection portion 311 and the fourth electrical connection portion 321, that is, the "bridge" part, can connect the fourth connection portion 211 to the second electrical connection portion 121 to form the first path 10.

In conclusion, in the circuit board assembly of this application, the power supply (that is, the second path 20) connected to the first circuit board 300 itself can be conducted, to perform a function of the first circuit board 300 itself. In addition, through the arrangement of the fourth connection portion 211 and the second electrical connection portion 121, and through the arrangement of the "bridge" part of the third electrical connection portion 311 and the fourth electrical connection portion 321, other power supplies and functional devices (that is, the first path 10) are conducted. In this way, this stack method of the circuit board assembly can not only meet needs of more functional devices, but also occupy less layout space, thereby improving the utilization of the circuit board assembly.

Further, for the first circuit board 300 with the flexible printed circuit structure, the circuit board assembly may further include a transition board 400. The transition board 400 can reinforce the first circuit board 300. Specifically, the transition board 400 can be stacked between the first circuit board 300 and the second connection base 210. In this way, the strength of the first circuit board 300 is partially increased, that is, a part of the first circuit board 300 used to mount the transition board 400 is increased in strength. In this way, the circuit board 300 is less likely to undergo deformations such as warping and torsion, thereby preventing the second connection base 210 and the first connector 120 mounted on the circuit board from deviating from the mounting positions due to a deformation.

The transition board 400 should not interfere with the conduction of the second path 20. Therefore, as shown in FIG. 6 and FIG. 7, a surface of the transition board 400 that faces the second connection base 210 may be provided with a sixth electrical connection portion 421, and a surface of the transition board 400 that faces the first circuit board 300 may be provided with a fifth electrical connection portion 411.

The sixth electrical connection portion 421, the fifth electrical connection portion 411, the fourth electrical connection portion 321, and the third electrical connection portion 311 may all be set as pads, and correspond to each other in position. In this way, the whole formed by the sixth electrical connection portion 421 and the fifth electrical connection portion 411 can play a role similar to that of the whole formed by the fourth electrical connection portion 321 and the third electrical connection portion 311, that is, the arrangement of the sixth electrical connection portion 421 and the fifth electrical connection portion 411 can be used as a "bridge" part of the transition board 400. The "bridge" part is used as a transitional link between the preceding and the following, and can cooperate with the "bridge" part formed by the fourth electrical connection portion 321 and the third electrical connection portion 311 to connect the fourth connection portion 211 to the second electrical connection portion 121. In other words, the fourth connection portion 211, the sixth electrical connection portion 421, the fifth electrical connection portion 411, the fourth electrical connection portion 321, the third electrical connection portion 311, and the second electrical connection portion 121 may be electrically connected in sequence to form the first path 10.

Further, for the connection method between the first connector 120 and the first circuit board 300, as shown in FIG. 4 and FIG. 5, the third electrical connection portion 311, the third connection portion 312, and the fourth electrical connection portion 321 are each provided with a plurality of pads. The pads of the third electrical connection portion 311 and the pads of the fourth electrical connection portion 321 correspond to each other respectively and are connected in sequence. For example, the pads of the third electrical connection portion 311 and the pads of the fourth electrical connection portion 321 form a plurality of electrode pillars running through the first circuit board 300, or an electric wire is arranged between the pads of the third electrical connection portion 311 and the pads of the fourth electrical connection portion 321.

In addition, as shown in FIG. 1 and FIG. 2, the second electrical connection portion 121 and the second connection portion 122 may be each provided with a plurality of pins. The pins of the second electrical connection portion 121 and the pads of the third electrical connection portion 311 correspond to each other respectively and connected in sequence. The pins of the second connection portion 122 and the pads of the third connection portion 312 correspond to each other respectively and connected to each other. In this way, the first connector 120 is welded to the first circuit board 300 through the connection between the pads and the pins, such as using SMT patch or DIP insertion welding.

The foregoing design of the pads and the pins can not only ensure a firm connection between the first connector 120, the first circuit board 300, the transition board 400, and the second connection base 210 through welding, but also ensure effective electrical conduction of the second path 20 and effective electrical conduction of the first path 10.

As shown in FIG. 6 and FIG. 7, for the connection methods between the transition board 400 and the second connection base 210 and between the transition board 400 and the first circuit board 300, the fifth electrical connection portion 411 and the sixth electrical connection portion 421 may also be each provided with a plurality of pads, and the pads of the fifth electrical connection portion 411 and the pads of the sixth electrical connection portion 421 correspond to each other respectively and connected in sequence. For example, the pads of the fifth electrical connection portion 411 and the pads of the sixth electrical connection portion 421 form a plurality of electrode pillars running through the transition board 400, or an electric wire is arranged between the pads of the fifth electrical connection portion 411 and the pads of the sixth electrical connection portion 421.

In addition, as shown in FIG. 1 and FIG. 3, the fourth connection portion 211 may be provided with a plurality of pins, and the pads of the sixth electrical connection portion 421 and the pins of the fourth connection portion 211 correspond to each other respectively and are connected in sequence, so that the second connection base 210 and the transition board 400 are welded to each other.

It should be further pointed out that the pads of the fourth electrical connection portion 321 and the pads of the fifth electrical connection portion 411 correspond to each other respectively and are connected in sequence, so that the first circuit board 300 and the transition board 400 are welded to each other.

In this way, the first connector 120, the first circuit board 300, the transition board 400, and the second connection base 210 are stacked in sequence through welding to form the circuit board assembly. In addition, the pins of the second electrical connection portion 121, the pads of the third electrical connection portion 311, the pads of the fourth electrical connection portion 321, the pads of the fifth electrical connection portion 411, the pads of the sixth electrical connection portion 421, and the pins of the fourth connection portion 211 correspond to each other respectively and connected in sequence to form the first path 10. The pins of the second connection portion 122 and the pads of the third connection portion 312 correspond to each other respectively and connected to each other to form the second path 20.

More specifically, as shown in FIG. 6, the transition board 400 may further include a reserved connection portion 412. The reserved connection portion 412 may be an electrode pillar running through the transition board 400, to serve as a spare region in which the fifth electrical connection portion 411 and the sixth electrical connection portion 421 are located. If the fifth electrical connection portion 411 and the sixth electrical connection portion 421 are damaged, the transition board 400 can be mounted in a reverse direction to establish a connection relationship between the reserved connection portion 412 and the fourth electrical connection portion 321 and the fourth connection portion 211 to prevent the first path 10 from being disconnected.

The foregoing is an introduction to the structure of the circuit board assembly. The following continues to introduce the circuit board stack structure on which the circuit board assembly is mounted.

Figure 9:
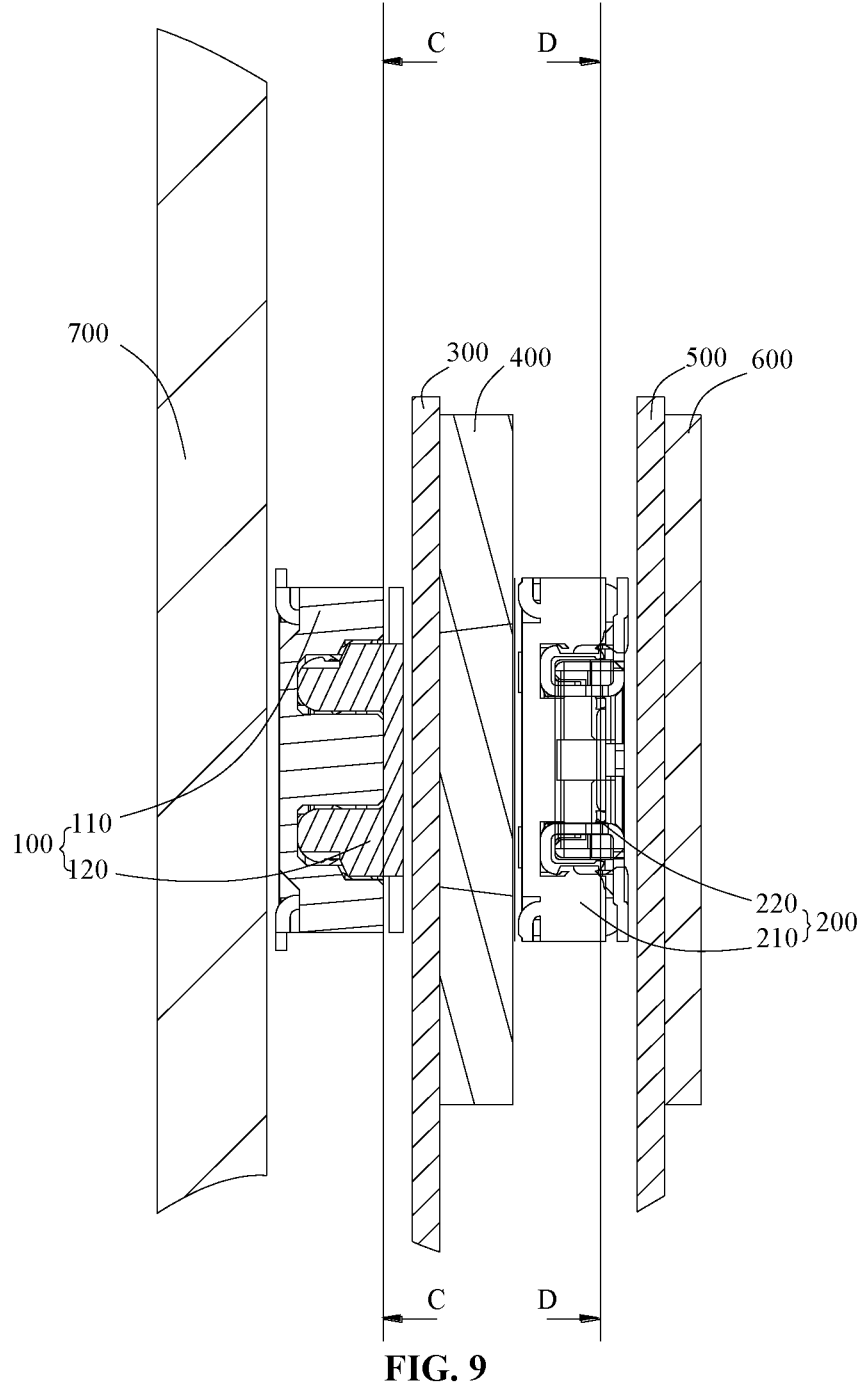
FIG. 9 is a structural diagram of a circuit board stack structure according to an embodiment of this application.

As described above, the third circuit board 700, the circuit board assembly, and the second circuit board 500 are stacked in sequence. In addition, as shown in FIG. 9, a surface of the third circuit board 700 that faces the circuit board assembly is provided with a first connection base 110. In this way, the third circuit board 700 is connected to a first connector 120 through the first connection base 110. For example, the first connection base 110 is welded to the first connector 120.

In addition, a surface of the second circuit board 500 that faces the circuit board assembly is provided with a second connector 220, and the second circuit board 500 is connected to the second connection base 210 through the second connector 220. For example, the second connector 220 is welded to the second connection base 210.

As shown in FIG. 9 to FIG. 12, the third circuit board 700 may be provided with a first receiving portion 701 and a second receiving portion 702. The first connection base 110 may be provided with a first electrical connection portion 111 and a first connection portion 112. The second connector 220 may be provided with a fifth connection portion 221. The second circuit board 500 may be provided with a sixth connection portion 501.

In this way, in the first path 10, the sixth connection portion 501, the fifth connection portion 221, the fourth connection portion 211, the sixth electrical connection portion 421, the fifth electrical connection portion 411, the fourth electrical connection portion 321, the third electrical connection portion 311, the second electrical connection portion 121, the first electrical connection portion 111, and the first receiving portion 701 are electrically connected in sequence. An electric wire connected to the sixth connection portion 501, such as a second conducting wire may be laid on the second circuit board 500. An electric wire connected to the first receiving portion 701, such as a third conducting wire may be laid on the third circuit board 700. In this way, when the second circuit board 500 is connected to the power supply through the second conducting wire, the electric energy can be transmitted to the first receiving portion 701 through the first path 10, and then transmitted to a corresponding functional device through the third conducting wire laid on the third circuit board 700.

In the second path 20, the first conducting wire on the first circuit board 300, the third connection portion 312, the second connection portion 122, the first connection portion 112, and the second receiving portion 702 are electrically connected in sequence. In addition, an electric wire connected to the second receiving portion 702, such as a fourth conducting wire is laid on the third circuit board 700. In this way, when the first circuit board 300 is connected to the power supply through the first conducting wire, the electric energy can be transmitted to the second receiving portion 702 through the second path 20, and then transmitted to a corresponding functional device through the fourth conducting wire laid on the third circuit board 700.

In conclusion, there are two different paths formed in the circuit board stack structure at the same time through stacking, such as the first path and the second path, thereby supplying power to different functional devices, for example, supplying power to a lens and a memory separately, or supplying power to different lenses. In this way, in the circuit board stack structure in this application, more circuit boards can be laid out without changing a wiring area, thereby improving the integration and utilization of the circuit board stack structure, and further meeting power supply needs of more functional devices.

More specifically, the first connector 120 is plugged into the first connection base 110. For example, the first electrical connection portion 111 and the first connection portion 112 are each provided with a socket, and the second electrical connection portion 121 and the second connection portion 122 are each provided with a plug. The first electrical connection portion 111 and the second electrical connection portion 121 are plugged into each other, and the first connection portion 112 and the second connection portion 122 are plugged into each other. The first connection base 110 and the first connector 120 form a first board-to-board connector 100.

The second connector 220 is plugged into the second connection base 210. For example, the fourth connection portion 211 is provided with a socket, the fifth connection portion 221 is provided with a plug, and the fourth connection portion 211 and the fifth connection portion 221 are plugged into each other. The second connector 220 and the second connection base 210 form a second board-to-board connector 200.

In this structure, specifically, matching electrical contacts are arranged between the socket of the first electrical connection portion 111 and the plug of the second electrical connection portion 121, between the socket of the first connection portion 112 and the plug of the second connection portion 122, and between the socket of the fourth connection portion 211 and the plug of the fifth connection portion 221. When the first board-to-board connector 100 is formed through plugging, and the second board-to-board connector 200 is formed through plugging, electrical conduction is completed between the matching plugs and sockets through contacting between the electrical contacts, that is, the first board-to-board connector 100 and the second board-to-board connector 200 form an electrical conductor after being formed through plugging, and the structural arrangement of the board-to-board connector is more suitable for the electrical connection of the apparatus of this application.

Figure 10:
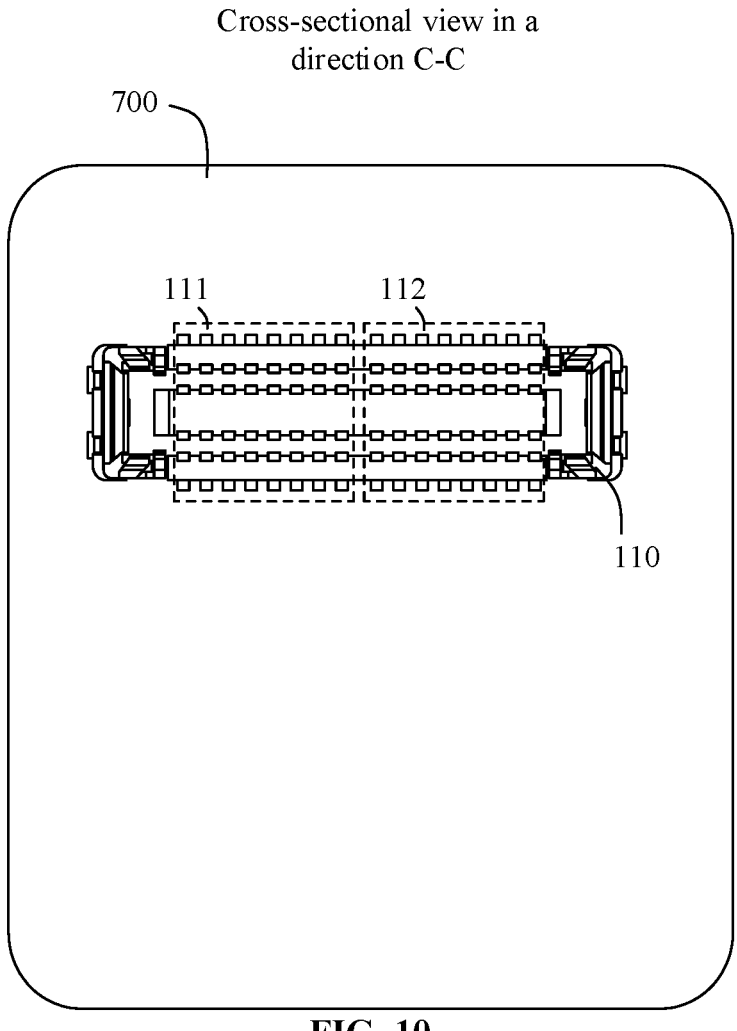
FIG. 10 is a cross-sectional view in a direction C-C of FIG. 9 according to an embodiment of this application.

Further, as shown in FIG. 10, the first connection base 110 is provided with a first socket, a first part of the first socket is located at the first electrical connection portion 111, and a second part of the first socket is located at the first connection portion 112. The first part of the first socket is in communication with the second part of the first socket.

As shown in FIG. 2, the first connector 120 is provided with a first plug, a first part of the first plug is located at the second electrical connection portion 121, and a second part of the first plug is located at the second connection portion 122. The first part of the first plug is in communication with the second part of the first plug.

The first plug is plugged into the first socket, and the first socket and the first plug are provided with matching electrical contacts for the electrical conduction between the first connection base 110 and the first connector 120.

Through the arrangement in which the first electrical connection portion 111 and the first connection portion 112 share the first socket, and the second electrical connection portion 121 and the second connection portion 122 share the first plug, a gap between the first electrical connection portion 111 and the first connection portion 112 and a gap between the second electrical connection portion 121 and the second connection portion 122 can be omitted, further reducing the layout space and improving the utilization of the circuit board stack structure.

More specifically, as shown in FIG. 9 and FIG. 10, the first receiving portion 701 and the second receiving portion 702 may be each provided with a plurality of pads, and the first electrical connection portion 111 and the first connection portion 112 may be each provided with a plurality of pins. The pads of the first receiving portion 701 and the pins of the first electrical connection portion 111 correspond to each other respectively and are connected in sequence, for example, the pins and the pads are welded to each other through SMT patch or DIP insertion, so that the first connection base 110 is welded to the third circuit board 700.

Figure 11:
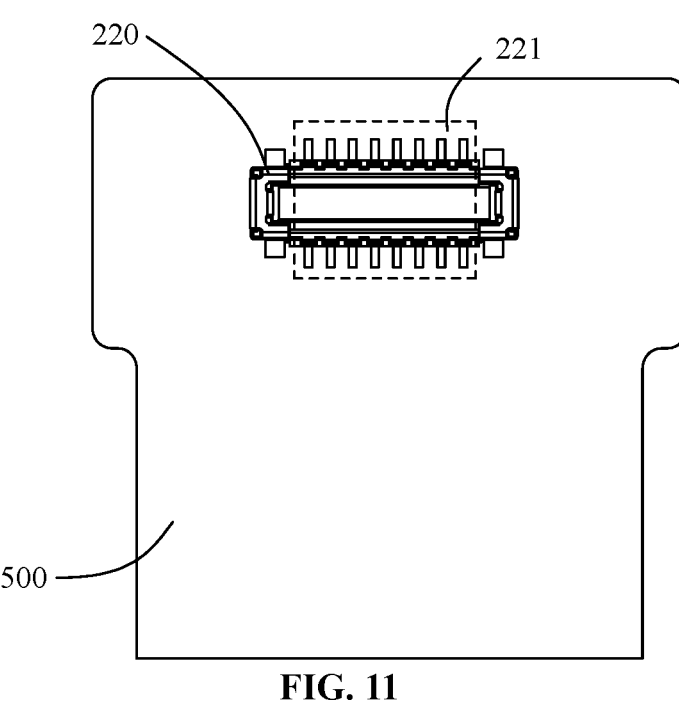
FIG. 11 is a cross-sectional view in a direction D-D of FIG. 9 according to an embodiment of this application.
Figure 12:
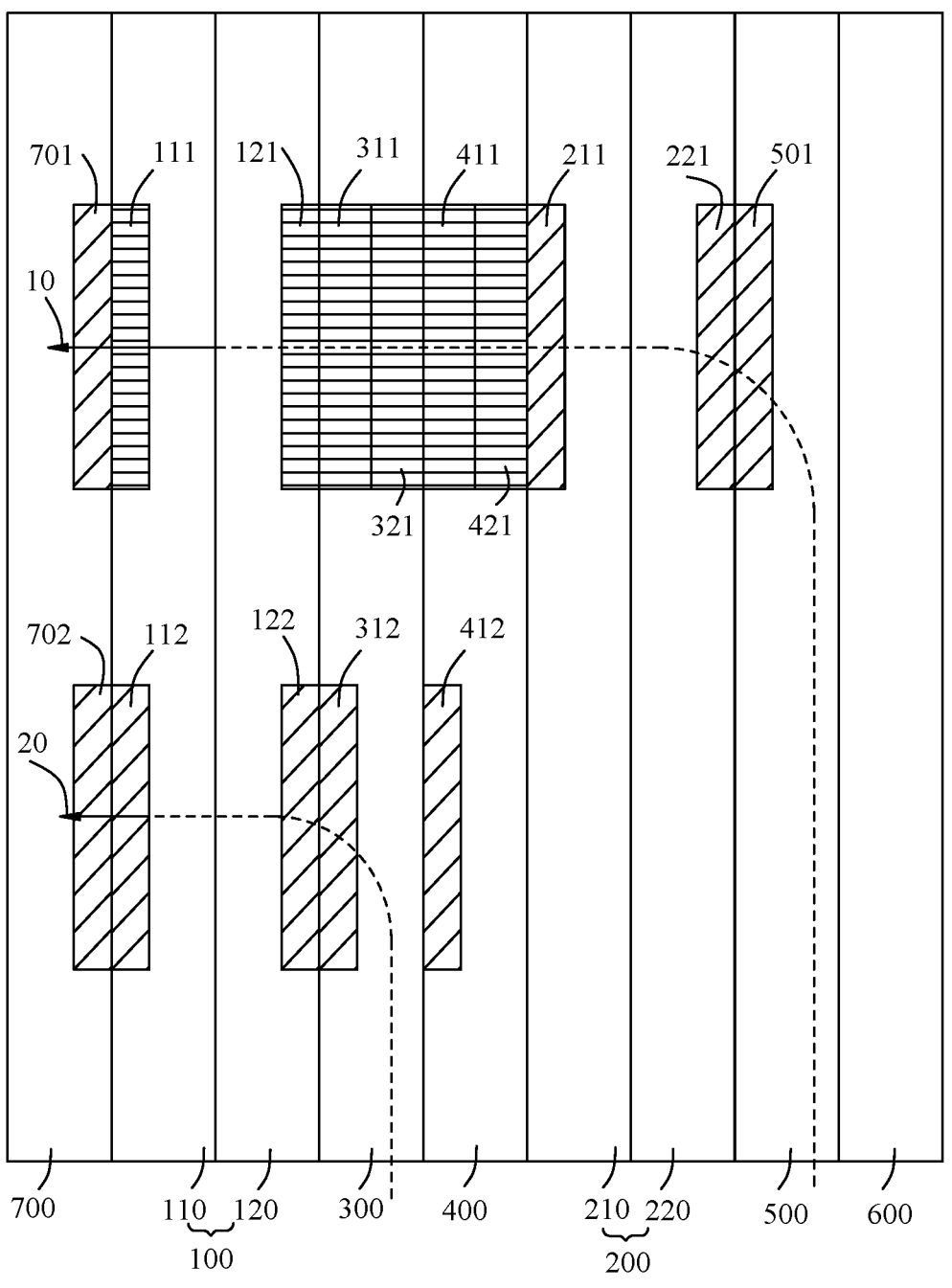
FIG. 12 is a path diagram of a first path and a second path in a circuit board stack structure according to an embodiment of this application.

As shown in FIG. 9 and FIG. 11, the sixth connection portion 501 is provided with a plurality of pads, and the fifth connection portion 221 is provided with a plurality of pins. The pins of the fifth connection portion 221 and the pads of the sixth connection portion 501 correspond to each other respectively and are connected in sequence, for example, the pins and the pads are welded to each other through SMT patch or DIP insertion, so that the second connector 220 is welded to the second circuit board 500.

In addition, the pins of the first electrical connection portion 111 and the pins of the second electrical connection portion 121 correspond to each other respectively, and the pins of the first connection portion 112 and the pins of the second connection portion 122 correspond to each other respectively. In this way, with the arrangement of the electrical contacts, after the first connection base 110 and the first connector 120 are assembled, the pins of the first electrical connection portion 111 and the pins of the second electrical connection portion 121 can be connected to each other to achieve electrical conduction, and the pins of the first connection portion 112 and the pins of the second connection portion 122 can be connected to each other to achieve electrical conduction.

In this way, the third circuit board 700, the first board-to-board connector 100, the first circuit board 300, the transition board 400, the second board-to-board connector 200, and the second circuit board 500 are stacked in sequence through welding to form the circuit board stack structure.

In addition, the pads of the first receiving portion 701, the pins of the first electrical connection portion 111, the pins of the second electrical connection portion 121, the pads of the third electrical connection portion 311, the pads of the fourth electrical connection portion 311, the pads of the fourth electrical connection portion 321, the pads of the fifth electrical connection portion 411, the pads of the sixth electrical connection portion 421, the pins of the fourth connection portion 211, the pins of the fifth connection portion 221, and the pads of the sixth connection portion 501 correspond to each other respectively and connected in sequence to form the first path 10.

The pads of the second receiving portion 702, the pins of the first connection portion 112, the pins of the second connection portion 122, and the pads of the third connection portion 312 correspond to each other respectively and connected in sequence to form the second path 20.

The foregoing design of the pads and the pins can not only ensure a firm connection between the third circuit board 700, the circuit board assembly, and the second circuit board through welding, but also ensure effective electrical conduction of the second path 20 and effective electrical conduction of the first path 10.

More specifically, as shown in FIG. 9, the circuit board stack structure may include a reinforcement board 600. The reinforcement board 600 is stacked on a side of the second circuit board 500 that faces away from the second connector 220. For the second circuit board 500 with a flexible printed circuit structure, the arrangement of the reinforcement board 600 can increase the overall strength of the second circuit board 500 and prevent abnormal deformations such as warping and torsion.

Figure 13:
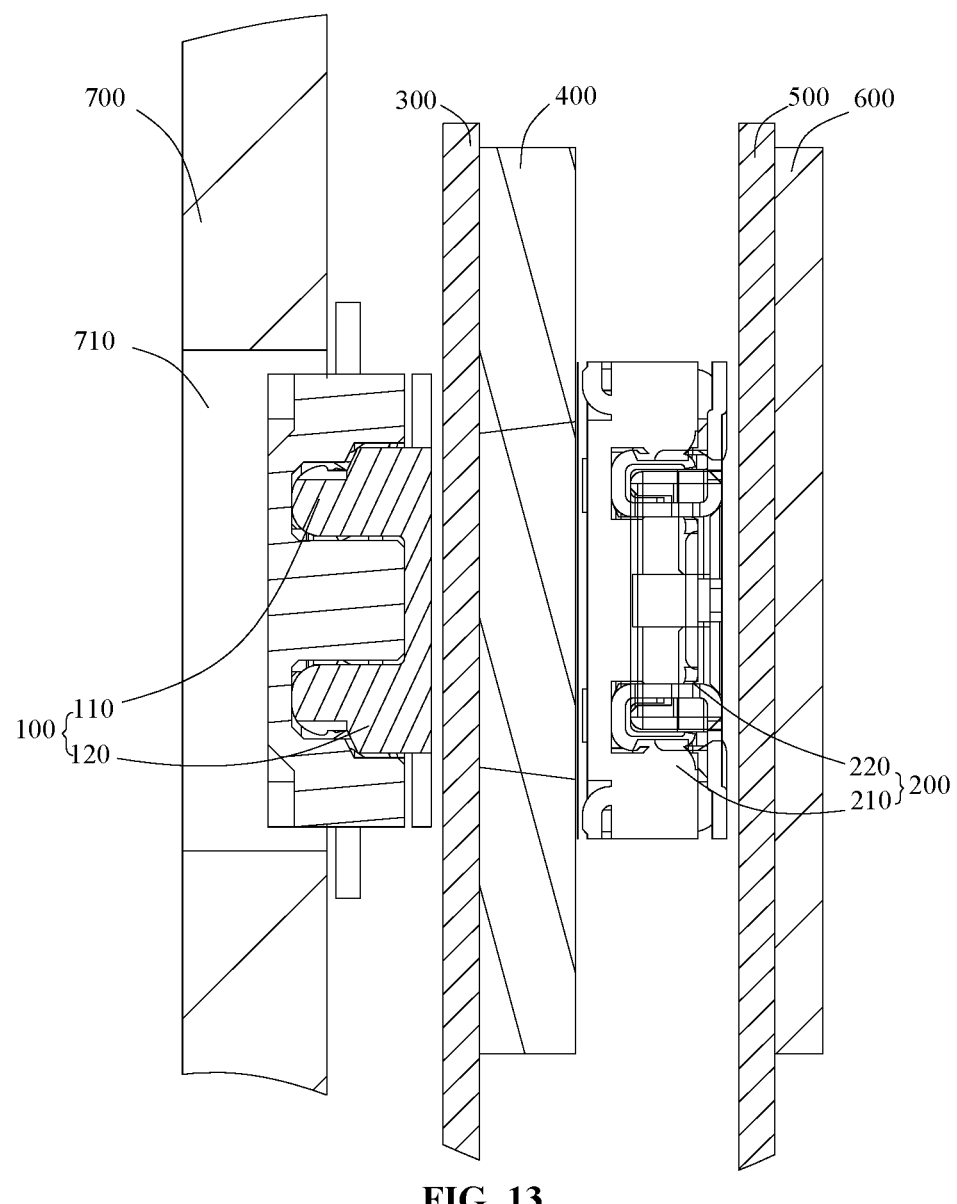
FIG. 13 is another structural diagram of a circuit board stack structure according to an embodiment of this application.

Furthermore, as shown in FIG. 13, the third circuit board 700 can be provided with an accommodating hole 710, and at least part of the first connection base 110 is arranged in the accommodating hole 710. This structure can realize at least partial overlapping between the first connection base 110 and the third circuit board 700 in a height direction of stacking, thereby thinning the circuit board stack structure.

More specifically, the pads of the first receiving portion 701 and the pads of the second receiving portion 702 may be arranged around the accommodating hole 710, and the pins of the first electrical connection portion 111 and the pins of the first connection portion 112 may be arranged peripherally around the first connection base 110 to achieve a better fit between the two.

The electronic device disclosed in the embodiments of this application may be a smart phone, a tablet computer, an e-book reader, a wearable device (such as a smart watch, or smart glasses), or the like. The electronic device includes the circuit board assembly, and the embodiments of this application do not limit specific types of the electronic device.

It is to be understood that the above are only embodiments of this application and are not intended to limit this application. For a person skilled in the art, various modifications and changes can be made to this application. Any modification, equivalent replacement, or improvement made application spirit and principle of this application shall fall within the scope of the claims of this application.

What is claimed is:

1. A circuit board assembly, comprising a first connector, a first circuit board, and a second connection base that are stacked in sequence, wherein
   the first connector is provided with a second electrical connection portion and a second connection portion, and the second connection base is provided with a fourth connection portion;
   a surface of the first circuit board that faces the first connector is provided with a third electrical connection portion and a third connection portion, and a surface of the first circuit board that faces the second connection base is provided with a fourth electrical connection portion;

the first circuit board comprises a first conducting wire, and the first conducting wire, the third connection portion, and the second connection portion are electrically connected in sequence to form a second path;

the fourth connection portion, the fourth electrical connection portion, the third electrical connection portion, and the second electrical connection portion are electrically connected in sequence to form a first path;

the circuit board assembly further comprises a transition board, and the transition board is stacked between the first circuit board and the second connection base;

a surface of the transition board that faces the second connection base is provided with a sixth electrical connection portion, and a surface of the transition board that faces the first circuit board is provided with a fifth electrical connection portion; and the fourth connection portion, the sixth electrical connection portion, the fifth electrical connection portion, the fourth electrical connection portion, the third electrical connection portion, and the second electrical connection portion are electrically connected in sequence to form the first path.

2. The circuit board assembly according to claim 1, wherein the third electrical connection portion, the third connection portion, the fourth electrical connection portion, the fifth electrical connection portion, and the sixth electrical connection portion are each provided with a plurality of pads;

the fourth connection portion, the second electrical connection portion, and the second connection portion are each provided with a plurality of pins;

the pins of the second electrical connection portion, the pads of the third electrical connection portion, the pads of the fourth electrical connection portion, the pads of the fifth electrical connection portion, the pads of the sixth electrical connection portion, and the pins of the fourth connection portion correspond to each other respectively and connected in sequence; and the pins of the second connection portion and the pads of the third connection portion correspond to each other respectively and connected to each other.

3. A circuit board stack structure, comprising a third circuit board, a circuit board assembly, and a second circuit board that are stacked in sequence, wherein the circuit board assembly comprises a first connector, a first circuit board, and a second connection base that are stacked in sequence, the first connector is provided with a second electrical connection portion and a second connection portion, and the second connection base is provided with a fourth connection portion;

a surface of the first circuit board that faces the first connector is provided with a third electrical connection portion and a third connection portion, and a surface of the first circuit board that faces the second connection base is provided with a fourth electrical connection portion;

the first circuit board comprises a first conducting wire, and the first conducting wire, the third connection portion, and the second connection portion are electrically connected in sequence to form a second path;

the fourth connection portion, the fourth electrical connection portion, the third electrical connection portion, and the second electrical connection portion are electrically connected in sequence to form a first path;

a surface of the third circuit board that faces the circuit board assembly is provided with a first connection base, and the third circuit board is connected to the first connector through the first connection base;

a surface of the second circuit board that faces the circuit board assembly is provided with a second connector, and the second circuit board is connected to the second connection base through the second connector;

the third circuit board is provided with a first receiving portion and a second receiving portion, the first connection base is provided with a first electrical connection portion and a first connection portion, the second connector is provided with a fifth connection portion, and the second circuit board is provided with a sixth connection portion;

in the first path, the sixth connection portion, the fifth connection portion, the fourth connection portion, the fourth electrical connection portion, the third electrical connection portion, the second electrical connection portion, the first electrical connection portion, and the first receiving portion are electrically connected in sequence; and in the second path, the first conducting wire, the third connection portion, the second connection portion, the first connection portion, and the second receiving portion are electrically connected in sequence.

4. The circuit board stack structure according to claim 3, wherein the circuit board assembly further comprises a transition board, and the transition board is stacked between the first circuit board and the second connection base;

a surface of the transition board that faces the second connection base is provided with a sixth electrical connection portion, and a surface of the transition board that faces the first circuit board is provided with a fifth electrical connection portion; and in the first path, the sixth connection portion, the fifth connection portion, the fourth connection portion, the sixth electrical connection portion, the fifth electrical connection portion, the fourth electrical connection portion, the third electrical connection portion, the second electrical connection portion, the first electrical connection portion, and the first receiving portion are electrically connected in sequence.

5. The circuit board stack structure according to claim 4, wherein the first connector is plugged into the first connection base, and the first connection base and the first connector form a first board-to-board connector; and the second connector is plugged into the second connection base, and the second connector and the second connection base form a second board-to-board connector.

6. The circuit board stack structure according to claim 4, wherein the first receiving portion, the second receiving portion, the third electrical connection portion, the third connection portion, the fourth electrical connection portion, the fifth electrical connection portion, the sixth electrical connection portion, and the sixth connection portion are each provided with a plurality of pads;

the first electrical connection portion, the first connection portion, the fourth connection portion, the fifth connection portion, the second electrical connection portion, and the second connection portion are each provided with a plurality of pins;

the pads of the first receiving portion, the pins of the first electrical connection portion, the pins of the second electrical connection portion, the pads of the third electrical connection portion, the pads of the fourth electrical connection portion, the pads of the fifth electrical connection portion, the pads of the sixth electrical connection portion, the pins of the fourth connection portion, the pins of the fifth connection portion, and the pads of the sixth connection portion correspond to each other respectively and connected in sequence; and the pads of the second receiving portion, the pins of the first connection portion, the pins of the second connection portion, and the pads of the third connection portion correspond to each other respectively and connected in sequence.

7. The circuit board stack structure according to claim 3, wherein the third circuit board is provided with an accommodating hole, and at least part of the first connection base is arranged in the accommodating hole.

8. The circuit board stack structure according to claim 3, wherein the circuit board stack structure comprises a reinforcement board, and the reinforcement board is stacked on a side of the second circuit board that faces away from the second connector.

9. An electronic device, comprising a circuit board assembly, wherein the circuit board assembly comprises a first connector, a first circuit board, and a second connection base that are stacked in sequence, wherein the first connector is provided with a second electrical connection portion and a second connection portion, and the second connection base is provided with a fourth connection portion;

a surface of the first circuit board that faces the first connector is provided with a third electrical connection portion and a third connection portion, and a surface of the first circuit board that faces the second connection base is provided with a fourth electrical connection portion;

the first circuit board comprises a first conducting wire, and the first conducting wire, the third connection portion, and the second connection portion are electrically connected in sequence to form a second path;

the fourth connection portion, the fourth electrical connection portion, the third electrical connection portion, and the second electrical connection portion are electrically connected in sequence to form a first path;

the circuit board assembly further comprises a transition board, and the transition board is stacked between the first circuit board and the second connection base;

a surface of the transition board that faces the second connection base is provided with a sixth electrical connection portion, and a surface of the transition board that faces the first circuit board is provided with a fifth electrical connection portion; and the fourth connection portion, the sixth electrical connection portion, the fifth electrical connection portion, the fourth electrical connection portion, the third electrical connection portion, and the second electrical connection portion are electrically connected in sequence to form the first path.

10. The electronic device according to claim 9, wherein the third electrical connection portion, the third connection portion, the fourth electrical connection portion, the fifth electrical connection portion, and the sixth electrical connection portion are each provided with a plurality of pads;

the fourth connection portion, the second electrical connection portion, and the second connection portion are each provided with a plurality of pins;

the pins of the second electrical connection portion, the pads of the third electrical connection portion, the pads of the fourth electrical connection portion, the pads of the fifth electrical connection portion, the pads of the sixth electrical connection portion, and the pins of the fourth connection portion correspond to each other respectively and connected in sequence; and the pins of the second connection portion and the pads of the third connection portion correspond to each other respectively and connected to each other.

* * * * *